United States Patent [19]

Duchek et al.

[11] Patent Number: 4,724,474

[45] Date of Patent: Feb. 9, 1988

[54] POWER BRIDGE RECTIFIER ASSEMBLY

[75] Inventors: Richard J. Duchek, Schaumburg, Ill.; Alan V. Hayes, E. Northport, N.Y.; Gregory T. Laux, Arlington Heights; Francis M. Ray, Glenview, both of Ill.

[73] Assignee: Zenith Electronics Corporation, Glenview, Ill.

[21] Appl. No.: 938,216

[22] Filed: Dec. 5, 1986

[51] Int. Cl.⁴ ............................................. H01L 29/44
[52] U.S. Cl. ....................................... 357/76; 357/69; 357/65; 357/68; 363/126
[58] Field of Search ........................... 357/76, 77, 69; 361/436, 2, 12, 126; 363/126, 144

[56] References Cited

PUBLICATIONS

Woodworth, "Epitaxial Diodes-Rectifiers Compatible with Today's Fast Switches", Electronic Components and Applications, vol. 6, No. 3, 1984.

*Primary Examiner*—Patrick R. Salce
*Assistant Examiner*—Jeffrey Starrett

[57] ABSTRACT

A bridge rectifier comprised of four passivated silicon diode chips coupled to convert an alternating voltage input to a direct voltage output includes four L-shaped leads each coupling the anode or cathode of one diode to either the same or opposite terminal of another diode. Each L-shaped lead includes transversely coupled first and second elongated, linear sections with the first sections of each lead forming either the AC input lines or DC output lines. The second section of each lead is coupled to either the anode or cathode of one of the diode chips, each of which includes a dielectric coated moat, or groove, around the periphery of one of its flat, generally rectangular shaped terminal surfaces which prevents charge migration on the edges of the chip and resulting leakage current. Each lead second section includes an upraised portion along the length thereof adapted for engaging and electrical coupling to either the anode or cathode surface of a diode, which when coupled to a diode terminal allows the remaining portion of the second lead section to be positioned in a spaced manner from the passivation moat as well as from an adjacent edge to prevent charge migration over the edge of the diode. In a second embodiment, the second lead section is provided with a pair of adjacent, facing upraised portions which provides for the interchangeability of all four leads.

10 Claims, 6 Drawing Figures

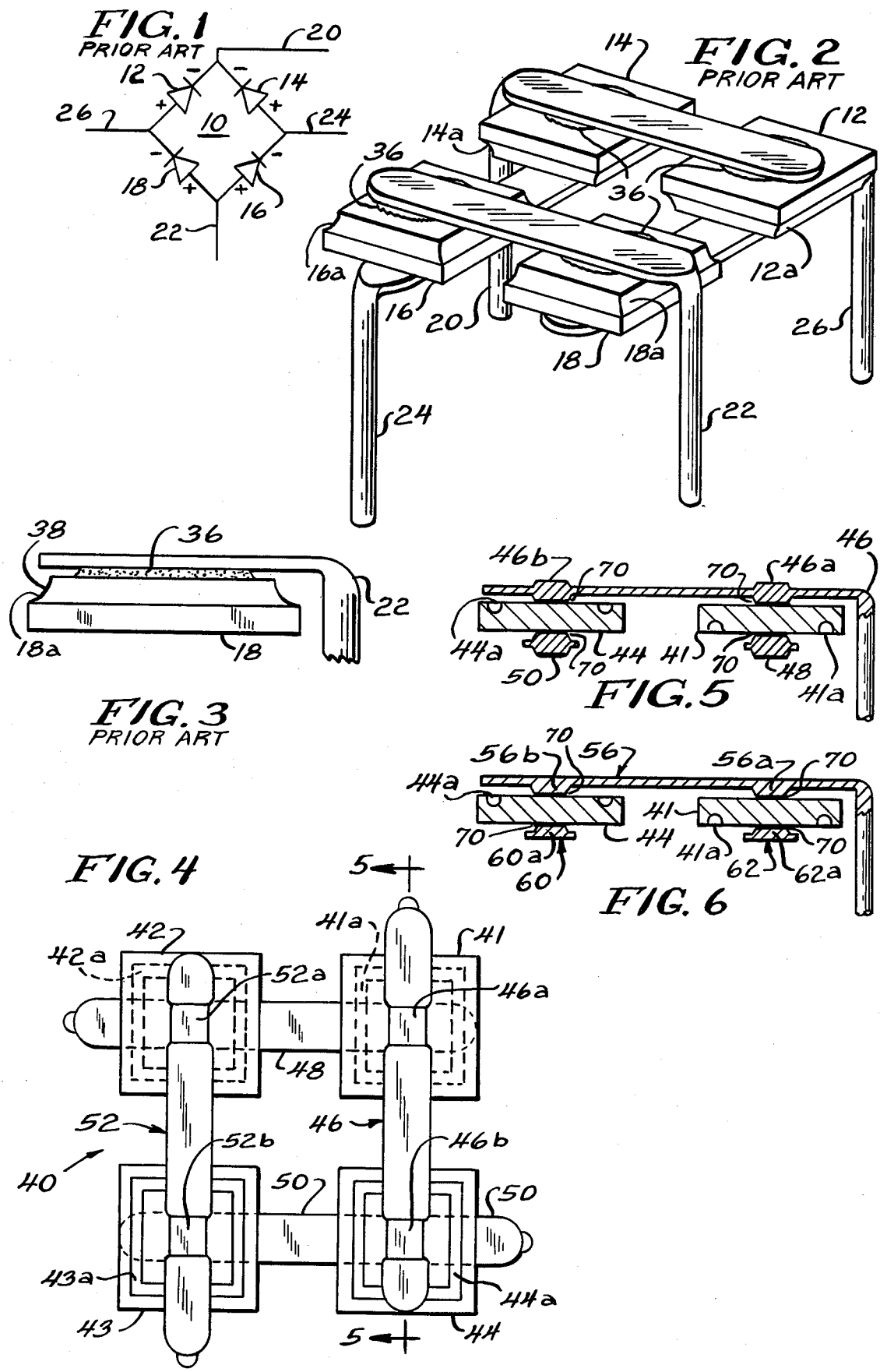

POWER BRIDGE RECTIFIER ASSEMBLY

BACKGROUND OF THE INVENTION

This invention relates generally to bridge rectifier circuits and is particularly directed to a lead frame for coupling four diode chips in a power bridge rectifier circuit.

Referring to FIG. 1, there is shown a simplified schematic diagram of a conventional bridge rectifier circuit 10. The bridge rectifier 10 includes four coupled diodes 12, 14, 16 and 18. The cathode of diode 18 and the anode of diode 12 are coupled to a first AC input lead 26, while the anode of diode 14 and the cathode of diode 16 are coupled to a second AC input lead 24. The unidirectional conducting nature of the diodes and the manner in which they are coupled in the bridge rectifier circuit causes an alternating input voltage provided to the diode combination as indicated in FIG. 1 to be converted to a DC, or direct voltage, output via lines 20 and 22.

Referring to FIG. 2, there is shown a perspective view of a conventional bridge rectifier corresponding to the electrical schematic of FIG. 1 incorporating four silicon, or semiconductor, chip diodes, where like reference numbers are used for identical elements in both figures. Thus, in FIG. 2 lead 22 is shown coupled to the anode upper surface of diode 16 and the anode upper surface of diode 18, while lead 20 is shown coupled to the cathode upper surface of diode 12 and the cathode upper surface of diode 14. Similarly, lead 24 is coupled to the cathode lower surface of diode 16 and the anode lower surface of diode 14, while lead 26 is coupled to the anode lower surface of diode 12 and the cathode lower portion of diode 18. Each of the conductive leads 20, 22, 24 and 26 is generally L-shaped and includes a first generally flat, elongated, linear section coupled to a diode terminal and a second cylindrical, elongated, linear section for coupling the bridge rectifier in the circuit.

Referring to FIG. 2 and to FIG. 3, which illustrates the details of the manner in which one of the diodes 18 is coupled in circuit in the bridge rectifier, it can be seen that one of the terminals, commonly the anode portion or surface, of each of the silicon chip diodes includes a grooved portion, or passivation moat, at the peripheral edge of the diode. Thus it can be seen that diodes 16 and 18 are respectively provided with passivation moats 16a and 18a which are closely spaced with respect to the edge of the diode and which extend around the entire anode surface of the diode. Similar passivation moat arrangements 12a and 14a are provided on the lower anode surfaces of diodes 12 and 14 in FIG. 2. Each of the passivation moats is coated with a dielectric material, preferably glass. The leads are attached to the diode chips by an electrically conductive die attaching material 36, most commonly a high temperature solder paste.

In some cases, a second dielectric material, commonly a silicone resin, is deposited around the lateral edges of the diode after the attaching process to further restrict migration of charge to the diode surface and thus improve device reliability. Usually, the assembled device is encapsulated in a third dielectric material, commonly an epoxy resin, which provides mechanical strength to the final part and also serves to improve the reliability of the part by protecting it from outside contamination.

The passivation moat 18a disposed about and within the anode surface of diode 18 serves to electronically isolate and provide a controlled contour to the diode junction, which eliminates premature voltage breakdown across the chip surface. The major function of the dielectric material 38 coating the groove is to prevent the migration of charge from outside the chip to the diode surface, which would degrade the electrical performance of the diode. The type of passivation moat illustrated in FIGS. 2 and 3 is termed a "half-moat" construction for reasons discussed below.

The conventional diode chip bridge described above which utilizes "half-moat" glass passivated diode chips is not capable of withstanding prolonged periods of exposure to high humidity environments, and in cases where such performance is required it would be advantageous to utilize "full-moat" passivated chips to provide higher reliability. The advantages of this type of construction are best related by a brief description of the usual methods of fabrication of each type, as given below.

"Half-moat" diodes are constructed by defining a gridwork of glass coated grooves in a semiconductor wafer and dicing the wafer into chips by cutting through the glassed grooves. "Full moat" diode chips, on the other hand, are obtained by patterning the semiconductor wafer with an array of closed glass passivated moats separated from each other by sufficient width to allow dicing through the semiconductor itself.

The humidity resistance of the "half-moat" devices is critically dependent upon the minimization of damage which may be done to the glass remaining on the chip either during the act of dicing or subsequent handling or electrical testing of the chip. Although certain dicing techniques have been developed which do not visibly fracture the glass passivation on the chips and which appear to yield devices which are satisfactory for some purposes, the fact remains that the reliability of such parts is variable, subject to the degree of control available in the cutting process. In addition, although thinner layers of glass in the groove are preferred because they are less subject to damage during dicing, they do not provide the bulk resistance to moisture that may be obtained with a thicker glass layer.

Since "full-moat" diode chips are separated by dicing through the semiconductor (well away from the junction) dicing damage in this case may be easily prevented. In addition, such chips are well known to be more rugged and resistant to surface damage (see "Epitaxial Diodes-Rectifiers Compatible With Today's Fast Switches," by A. Woodworth, *Electronic Components and Applications,* Vol. 6 No. 3, 1984, p. 186). Also, the glass thickness which may be used with the "full moat" chip is not restricted by dicing considerations.

Assembly of bridge diodes incorporating "full-moat" diode chips instead of "half-moat" types by the conventional method is impractical due to the presence of an excess unpassivated semiconductor portion around the edge of the chip which is electrically connected to the cathode and may easily come into electrical contact with the anode, thus providing an external current path which would have severely deleterious effects on device performance.

In addition, the prior art arrangement illustrated in FIGS. 2 and 3, in which "half-moat" diode chips are utilized, requires careful control of the amount of conductive attaching material 36 dispensed or otherwise provided to the chip/lead interface. Excessive quantities of this material applied to the top faces of the chips may cross over the edge of the chip and provide an external current path that would severely degrade device performance. Insufficient quantities of this material, on the other hand, may reduce the contact area or, especially in combination with imperfect part alignment, even result in no contact at all.

The present invention is intended to overcome the aforementioned limitations of the prior art by providing a lead frame arrangement for a bridge rectifier employing passivated silicon chip diodes which facilitates bridge rectifier manufacture, affords more reliable assembly of the bridge rectifier, provides for assembly of a higher reliability bridge rectifier, reduces the number of components in the bridge rectifier, and reduces the likelihood of diode leakage currents in the bridge rectifier circuit.

OBJECTS OF THE INVENTION

Accordingly, it is an object of the present invention to provide an improved diode coupling arrangement in a bridge rectifier circuit.

It is another object of the present invention to facilitate and reduce the cost of fabricating a diode bridge rectifier by improving yields.

Yet another object of the present invention is to provide an improved lead frame for a diode bridge rectifier which makes use of a minimum number of parts and reduces the possibility of package related diode leakage currents.

A further object of the present invention is to provide a single lead for use in all four positions in a power bridge rectifier circuit.

A still further object of the present invention is to provide a unitary lead for use in a bridge rectifier incorporating either full or half moat passivated silicon chips.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

FIG. 1 is an electrical schematic diagram of a conventional diode bridge rectifier circuit;

FIG. 2 is a perspective view of a prior art power bridge rectifier arrangement;

FIG. 3 is a sectional view of one of the silicon diode chips in the power bridge rectifier of FIG. 2;

FIG. 4 is a top plan view of a power bridge rectifier in accordance with the present invention;

FIG. 5 is a sectional view of the power bridge rectifier of FIG. 4 taken along sight line 5—5 therein; and FIG. 6 is a sectional view illustrating another embodiment of a power bridge rectifier in accordance with the principles of the present invention.

DETAILED DESCRIPTION OF THE PREFERRED EMBODIMENTS

Referring to FIG. 4, there is shown a top plan view of a power bridge rectifier 40 in accordance with the present invention. FIG. 5 is a sectional view of the power bridge rectifier 40 of FIG. 4 taken along sight line 5—5 therein showing additional details of the rectifier circuit.

Power bridge rectifier 40 includes first, second, third and fourth silicon chip diodes 41, 42, 43 and 44. Each of the four diodes is generally square in shape and includes a pair of anode and cathode terminals on respective facing surfaces thereof. Each diode anode terminal includes a closed, recessed portion, or passivation moat, adjacent to and around the periphery thereof. Thus, the first, second, third and fourth diodes 41, 42, 43 and 44 are respectively provided with passivation moats 41a, 42a, 43a and 44a. As shown on the figures, the third and fourth diodes 43, 44 include passivation moats 43a, 44a on the respective upper surfaces thereof, while the first and second diodes 41, 42 include passivation moats 41a, 42a on the respective lower surfaces thereof. The "full-moat" configuration in which each passivation moat is generally in the form of a groove or indentation in the anode surface of a silicon chip diode and is arranged in a closed configuration on the diode surface is shown. Each of the passivation moats has positioned therein a dielectric material to prevent migration of charge over the surface of the diode from its anode to its cathode. Current carried by each of the silicon chip diodes is thus internal to each of the diodes and an external leakage current is thus avoided.

The power bridge rectifier 40 further includes first, second, third and fourth generally L-shaped leads 46, 48, 50 and 52. Each of the L-shaped leads includes a first section coupled to respective terminals of a pair of diodes in the power bridge rectifier and a second section which is adapted for coupling the power bridge rectifier to other circuitry which is not shown in the figures for simplicity. Each of the aforementioned first sections of the four conductive leads further includes a pair of projections extending therefrom. Thus, the first lead 46 includes first and second projections 46a, 46b respectively coupled to the cathode of diode 41 and to the anode of diode 44. The second lead 48 includes first and second projections which are respectively coupled to the anodes of diodes 42 and 41. Third lead 50 also includes first and second projections which are coupled to respective cathodes of diodes 44 and 43. Finally, the fourth lead 52 includes first and second projections 52a, 52b which are respectively coupled to the cathode of diode 42 and to the anode of diode 43.

As shown in FIGS. 4 and 5, each of the projections on the various leads is formed by crimping the first section of a lead in two locations along its length so as to produce projections extending outward from the first section of the lead and generally perpendicular to its longitudinal axis. Each lead first section may be crimped by a stamping or coining operation in a conventional manner using apparatus well known to those skilled in the art. The projections on each of the leads permits the first section of each lead to be positioned in spaced relation from the terminal surface of the diode to which it is coupled. Maintaining the lead in a spaced manner from the diode terminal surface prevents migration of charge over the edge of the diode chip via the conductive lead. Charge migration between diode terminals by means of current external to the diode represents leakage current and improper diode operation. Various leads shown in FIGS. 4 and 5 are provided with a pair of projections which extend outward from the first section of the lead in both directions or on both sides of the lead's first section. This permits leads having a single configuration or shape to be used in all four positions of the power bridge rectifier circuit. Thus, the first, second, third and fourth leads 46, 48, 50 and 52 are completely interchangeable in the power bridge rectifier circuit shown in FIGS. 4 and 5.

Referring to FIG. 6, there is shown another embodiment of the present invention wherein fifth, sixth and seventh leads 56, 60 and 62 are also provided with respective projections thereon which extend from only one side of the first section of the lead. Thus, the fifth lead 56 is provided with first and second projections 56a, 56b which extend outward from the lead's first section toward the cathode of diode 41 and the anode of diode 44, respectively. Similarly, the sixth and seventh leads 60, 62 are provided with respective pluralities of projections 60a and 62a which extend from only one surface of the first section of the lead toward respective terminals on diodes 41 and 44. While the projection configuration on the fifth, sixth and seventh leads 56, 60 and 62 is more easily formed than the projection configuration on the leads illustrated in FIGS. 4 and 5, the projection arrangement on the fifth, sixth and seventh leads does not permit each of these leads to be used in an interchangeable manner in the power bridge rectifier circuit. For example, the projections on the first section of the lead extend either toward or away from the direction in which the second section of the lead extends. In the case of lead 56, the projections 56a and 56b extend toward the direction in which the second section of the lead is oriented. Thus, lead 56 could only be used when coupled to the upper terminal surfaces of a pair of diodes in the power bridge rectifier. Similarly, the respective projections 60a and 62a on the sixth and seventh leads 60, 62 extend in a direction away from the second section of each of these leads such that these leads could only be used when coupled to respective lower terminal surfaces of a pair of diodes in the power bridge rectifier. However, as in the case of the first, second, third and fourth leads 46, 48, 50 and 52 shown in FIGS. 4 and 5, the fifth, sixth and seventh leads 56, 60 and 62 shown in FIG. 6 serve to position each of these leads in a spaced manner from the diode surface terminal in preventing the migration of charge along the surface and over an edge of the diode between its terminals.

A conductive attaching material, such as solder paste 70, is positioned between the projections of each of the aforementioned leads and the diode surface terminal to which it is coupled for affixation and conductivity purposes as shown in FIGS. 5 and 6. In addition, a second dielectric material such as a silicone resin (not shown) may be deposited around the lateral edges of each diode after the attaching process to further restrict both migration of charge to the diode surface and intrusion of moisture and thus improve device reliability. Finally, the assembled device is typically encapsulated in a third dielectric material (also not shown for simplicity) such as an epoxy resin to provide mechanical strength to the final part and to isolate the part from outside contamination.

There has thus been shown a power bridge rectifier circuit which includes a lead frame for mounting and coupling four passivated silicon diode chips in circuit which through yield improvement reduces the cost of bridge rectifier manufacture, allows for the use of higher reliability "full-moat" glass passivated chips as well as conventional "half-moat" chips, and increases bridge rectifier reliability by essentially eliminating the possibility of diode leakage current. The lead frame is comprised of four L-shaped conductors, each of which is adapted for coupling to the terminals of a pair of diodes as well as to external circuitry. In one embodiment, a single lead configuration may be used for all four bridge rectifier leads.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. A bridge rectifier circuit comprising:
   four semiconductor chip diodes each having respective facing first and second terminal surfaces, wherein the first terminal surface of each of said diodes includes a groove positioned adjacent to an edge of the chip diode and extending substantially around the periphery thereof so as to form a closed area on said first terminal surface; and
   four unitary conductive leads each having first and second projecting portions thereon directly engaging and electrically coupled to respective terminal surfaces of a pair of said diodes in a manner so as to convert an alternating input voltage to a direct output voltage, wherein the projecting portion coupled to the first terminal surface of a chip diode is positioned within the closed area defined by the peripheral groove thereon.

2. The bridge rectifier circuit of claim 1 wherein each of said leads is generally L-shaped having first and second sections oriented generally transversely to each other.

3. The bridge rectifier circuit of claim 2 wherein said first and second projecting portions are on the first section of each of said conductors and extend generally perpendicular to the longitudinal axis of said first section.

4. The bridge rectifier circuit of claim 3 wherein said projecting portions extend toward the second conductor section on two of said conductors and away from the second conductor section on the other two conductors.

5. The bridge rectifier circuit of claim 3 wherein said projecting portions on the first section of each of said L-shaped leads extend toward and away from the second section of the same lead such that all four conductive leads are interchangeable in the bridge rectifier circuit.

6. The bridge rectifier circuit of claim 1 further including conductive attaching material, such as solder paste coupling the first and second projecting portions of each of said conductive leads to the terminal surface of a diode.

7. The bridge rectifier circuit of claim 1 wherein each conductive lead includes a pair of crimped portions each associated with and forming a respective projecting portion thereof.

8. The bridge rectifier of claim 1 wherein said first terminal surface comprises an anode terminal and said second terminal surface comprises a cathode terminal of a chip diode.

9. The bridge rectifier circuit of claim 1 wherein each of said chip diodes is generally rectangular and the groove in the first terminal surface of each of said chip diodes is positioned on the periphery of each of four edges of said chip diode defining the outer periphery thereof.

10. The bridge rectifier circuit of claim 1 wherein each of said chip diodes is generally rectangular and the groove in the first terminal surface of each of said chip diodes is comprised of four linear coupled recessed portions each generally parallel to and inwardly spaced from a respective edge of the chip diode.

* * * * *